(12) United States Patent
Stewart et al.

(10) Patent No.: US 6,591,027 B2
(45) Date of Patent: Jul. 8, 2003

(54) BI-STABLE MICRO-ACTUATOR AND OPTICAL SWITCH

(75) Inventors: Robert E. Stewart, Woodland Hills, CA (US); Agop H. Cherbettchian, Santa Monica, CA (US); Samuel Fersht, Studio City, CA (US); David B. Hall, La Crescenta, CA (US)

(73) Assignee: Litton Systems, Inc., Woodland Hills, CA (US)

( * ) Notice: Subject to any disclaimer, the term of this patent is extended or adjusted under 35 U.S.C. 154(b) by 11 days.

(21) Appl. No.: 09/794,773

(22) Filed: Feb. 27, 2001

(65) Prior Publication Data

US 2003/0077020 A1 Apr. 24, 2003

(51) Int. Cl.⁷ .................................................. G02B 6/26
(52) U.S. Cl. ............................ 385/16; 385/17; 385/18; 385/19; 359/872; 359/876
(58) Field of Search ............................. 385/15, 16, 17, 385/18, 19; 359/872, 876

(56) References Cited

U.S. PATENT DOCUMENTS

| | | | | |
|---|---|---|---|---|
| 4,129,290 A | * | 12/1978 | Popper | 267/160 |
| 4,701,011 A | | 10/1987 | Emkey et al. | |
| 4,932,745 A | | 6/1990 | Blonder | |
| 5,042,889 A | | 8/1991 | Benzoni | |
| 5,808,384 A | * | 9/1998 | Tabat et al. | 310/40 |
| 5,998,906 A | * | 12/1999 | Jerman et al. | 310/309 |
| 6,041,483 A | | 3/2000 | Burch | |
| 6,303,885 B1 | * | 10/2001 | Hichwa et al. | 200/181 |

OTHER PUBLICATIONS

Que, L., et al., Bent–Beam Electro–Thermal Actuators For High Force Applications, Department of Electrical and Computer Engineering, Department of Mechanical Engineering, University of Wisconsin, Madison, Wisconsin, Published by IEEE, Document No. O–7803–5194, Copyright 1999, pp. 31–36.

* cited by examiner

Primary Examiner—Alan E. Ullah
Assistant Examiner—Jennifer Doan

(57) ABSTRACT

A bi-stable micro-actuator is formed from a first and a second silicon-on-insulator wafer fused together at an electrical contact layer. A cover with a V-groove defines an optical axis. A collimated optical signal source in the V-groove couples an optical signal to an optical port in the V-groove. A mirror surface on a transfer member blocks or reflects the optical signal. The transfer member has a point of support at the first and second end. The mirror blocks or reflects the optical axis. An expandable structure applies a compressive force between the first and second point of support of the transfer member along a compressive axis to hold the transfer member in a bowed first state or a bowed second state. A control signal applied to a heating element in the expandable structure reduces the compressive force, switching the transfer member to a second state.

19 Claims, 8 Drawing Sheets

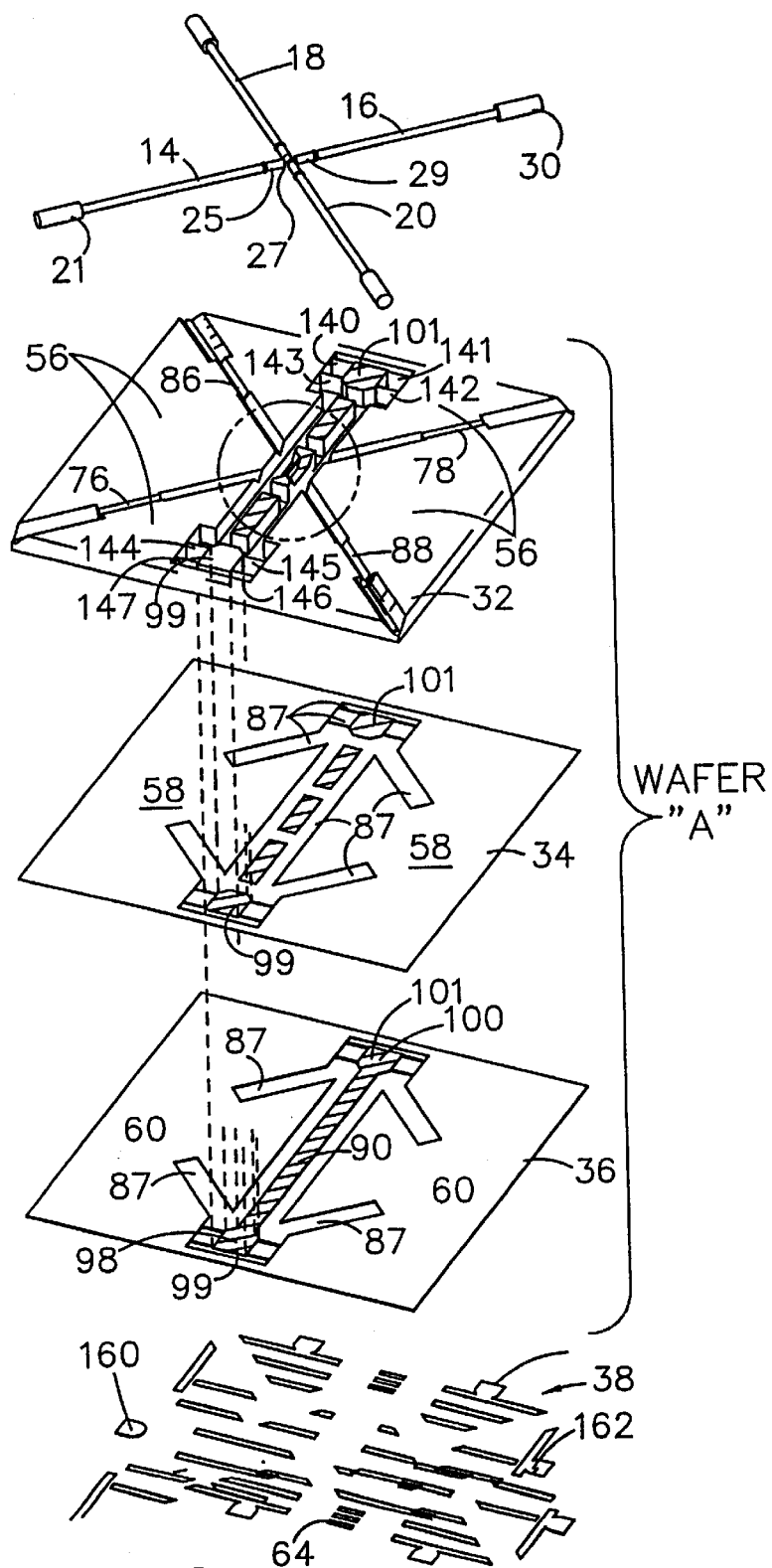
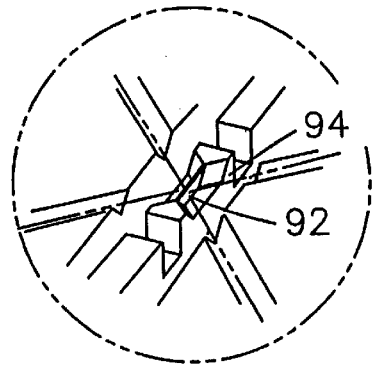
FIG. 2b
FIG. 2a

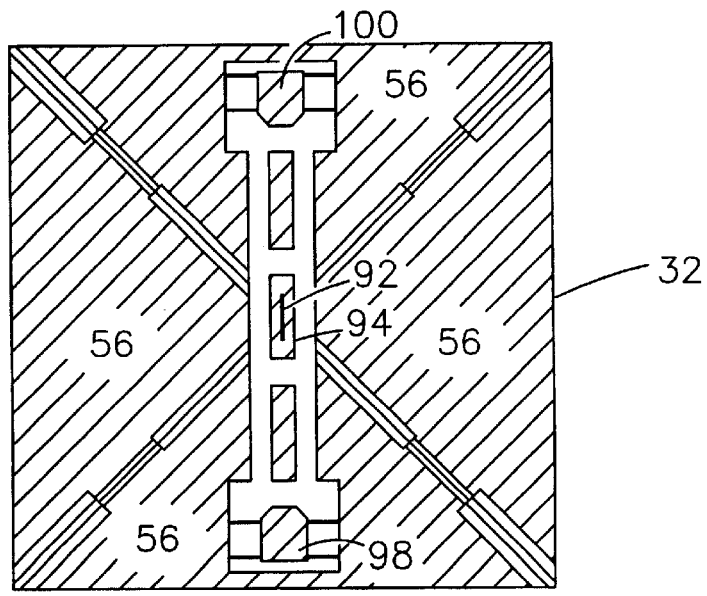
FIG. 4a — MIRROR HANDLE LAYER
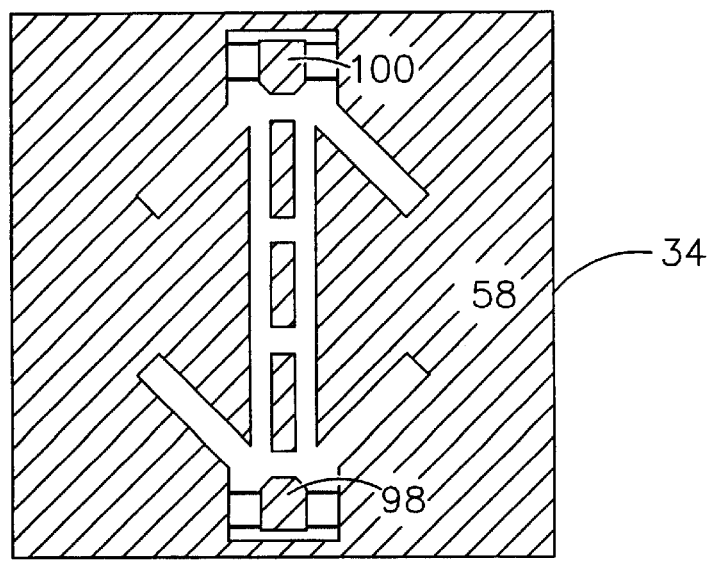
FIG. 4b — MIRROR SIO2 LAYER
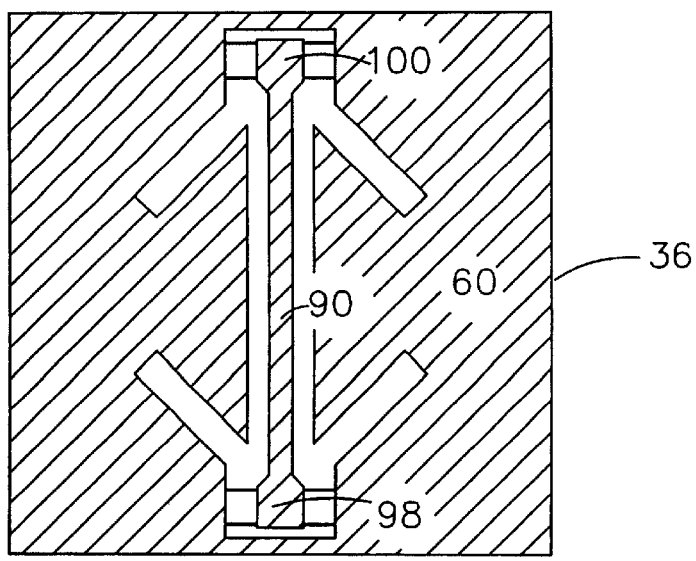
FIG. 4c — FLEXIBLE TRANSFER MEMBER DEVICE LAYER

BI-STABLE MICRO-ACTUATOR AND OPTICAL SWITCH

BACKGROUND OF THE INVENTION

1. Field of the Invention

This invention relates to the field of optical communications networks and more particularly to the field of fiber optic components and to micro-actuators made by MEMS (Micro Electro-mechanical Systems) related processes for use in optical switches.

2. Description of Related Art

Optical switches pass optical signals from one optical port to another optical port or serve to interrupt an optical signal in response to an electrical command such as a logic signal. In U.S. Pat. No. 4,932,745 to Blonder, assigned to AT&T, the disclosure of which is incorporated by reference herein in its entirety, an optical switching arrangement has a mirror which is positioned either out of an optical path or in an optical path to deflect optical signals between input and output fibers. The switching arrangement has first, second, third and fourth optical ports which are formed by respective proximate ends of first, second third and fourth fiber segments disposed in respective grooves etched or otherwise formed in a silicon substrate base. The switching arrangement further comprises first, second, third and fourth lenslets that serve to collimate the respective optical beams emanating from the first fiber, entering into the second fiber, or entering into the third or fourth fibers. The source for these optical beams is supplied by a light source (not shown) and is processed by known optical systems. The mirror has a frontal planar reflecting surface and may also have a rear planar parallel reflecting surface.

U.S. Pat. No. 5,042,889 assigned to AT&T, the disclosure of which is incorporated herein by reference in its entirety shows another type of optical switch.

SUMMARY OF THE INVENTION

The invention is a bi-stable micro-actuator shown in a first alternative embodiment as an optical switch. The actuator has a frame. A flexible transfer member is supported at a first and second point of support. The member has a compressive axis that extends from its first to its second point of support.

An expandable structure is coupled to the frame and has a first and second end coupled to drive the transfer member's first and second point of support. When assembled, the flexible transfer member is pre-stressed to compress the expandable structure and to hold the flexible transfer member in compression in a bowed state. The flexible transfer member has a central portion displaced in a vertical plane, from the compressive axis. A control signal, having a first state during which no voltage is applied to heater electrodes and a second state during which a pulse of voltage of predetermined amplitude and duration is applied to heater electrodes to heat elements of the expandable structure that expand to reduce the compressive force applied to the flexible transfer member. As the compressive force is relaxed, in response to the control signal assuming a second state, the central portion of the flexible transfer member moves past the compressive axis. As the flexible transfer member moves in response to application of the control signal second state, the control signal returns to a first state after a predetermined interval, the duration of the interval being selected to insure that the central portion of the flexible transfer member passes into a bowed second state from which return to the first state would be possible only by returning the control signal to the second state. The return of the control signal to a first state permits the heater to cool restoring the compressive force applied by the expandable structure to the flexible transfer member.

In another alternative embodiment a first collimated optical signal source is coupled to the frame to provide an optical signal via an optical signal path. A first optical port is coupled to the frame and co-axially aligned with the collimated signal source to receive the optical signal. A transfer member surface is positioned on the central portion of the flexible transfer member. The transfer member surface, such as a vertically disposed mirror surface, is positioned on the flexible tansfer member so as to be free of the optical signal path with the flexible transfer member, in compression, and in a bowed first state. The transfer member surface is moved to a position to totally block or reflect the optical signal path with the flexible transfer member in compression in a bowed second state. In this arrangement, the bi-stable micro-actuator functions to provide an optical switch function.

BRIEF DESCRIPTION OF THE DRAWINGS

FIG. 2*a* is an expanded exploded perspective view of the layers of wafer "A" and FIG. 2*b* is an expanded perspective view of a central portion of the view of FIG. 2*a* depicting the central portion of the flexible transfer member with a mirror atop the beam deflecting a first beam from the lower left and a second beam from the lower right in accordance with the present invention;

FIGS. 4*a*, 4*b* and 4*c* are plan views of the layers of wafer "A";

DETAILED DESCRIPTION OF THE PREFERRED EMBODIMENTS

Figure 1A:
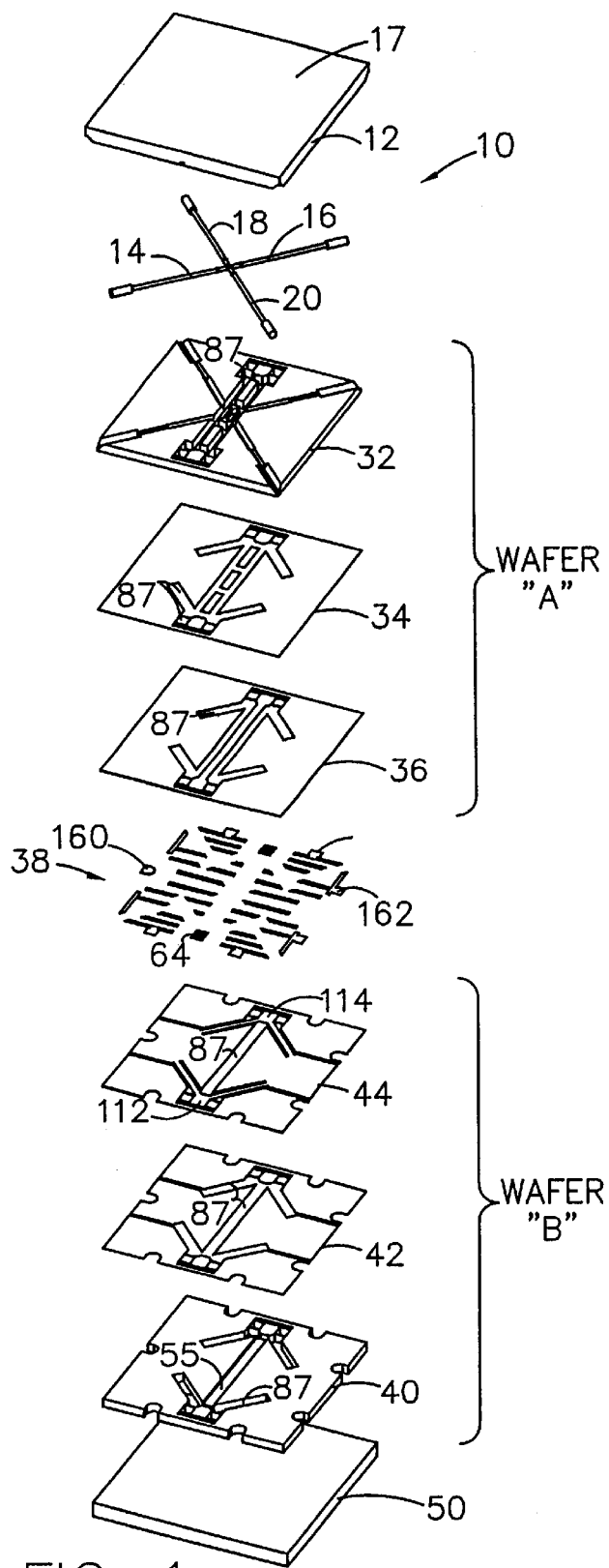
FIGS. 1*a* and 1*b* are exploded views of a bi-stable micro-actuator operating with an optical signal source and an optical port to function as an optical switch, the view of FIG. 1*a* being from a point above the stack and the view of FIG. 1*b* being from a point below the stack in accordance with the present invention.
Figure 1B:
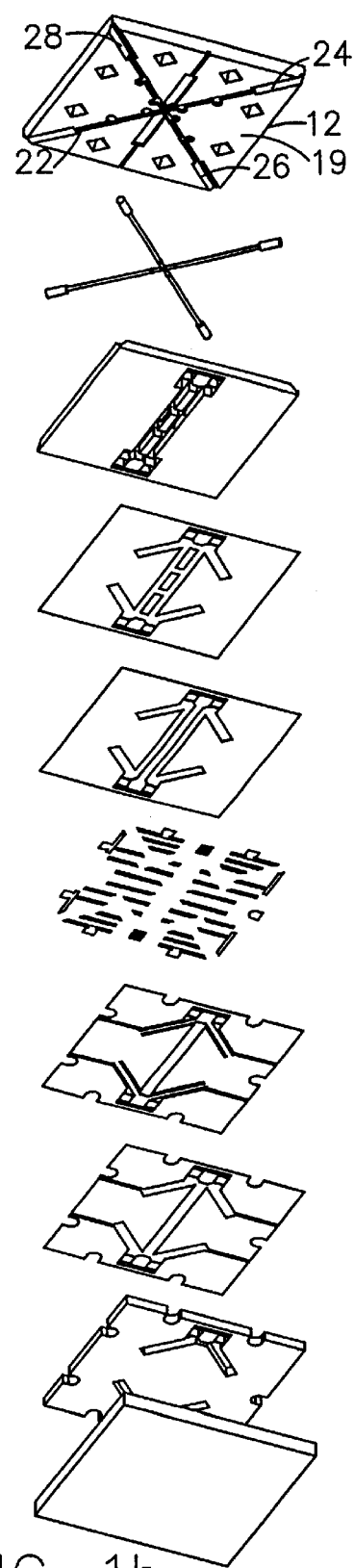
Figure 3:
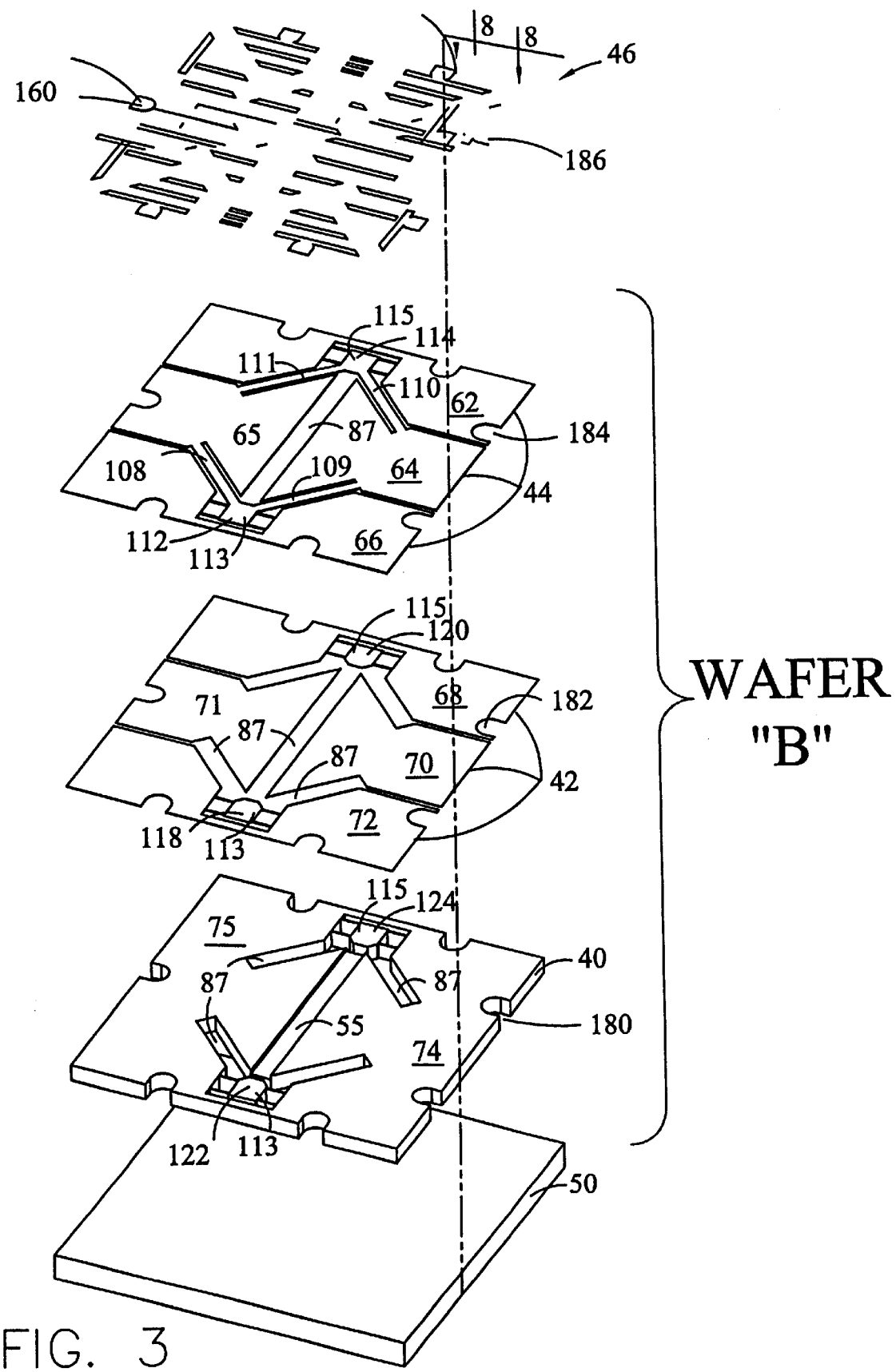
FIG. 3 is an expanded exploded perspective view of the layers of wafer "B"

In FIGS. 1*a* and 1*b*, a bi-stable micro-actuator 10 in accordance with an aspect of the present invention is formed using MEMS technology, from two commercially available SIO (silicon-on insulator) wafers, identified within vertical brackets as wafer "A", a first wafer, and wafer "B", a second wafer. The stack of layers in FIG. 1*a* are depicted from a view below the stack and the stack of layers in FIG. 1*b* are depicted from a view above the stack. It should be understood that the layers of wafers "A" and "B" are depicted as exploded in FIGS. 1*a*, 1*b*, 2*a*, 2*b* and 3 for illustrative purposes only. In practice the respective layers of wafer "A"

and wafer "B" are integral and are not separated as depicted. FIGS. 2a and 2b and 3 are enlarged portions of FIG. 1b looking from the bottom up. Void spaces that completely penetrate a layer are designated by reference number 87 and a void space 55 in FIG. 3 only partially penetrates handle layer 40. FIG. 2a shows the layers of wafer A and FIG. 3 shows the layers of wafer B.

FIGS. 1a, and 1b show a first cover 12 on the top of the stack. The cover has an outer surface 17 and an inner surface or base 19. In FIG. 1a, four optical fibers, 14, 16, 18 and 20 are shown below the first cover 12. FIGS. 1b and 2a show the bottom surface or base 19 of the first cover 12. V-grooves 22, 24, 26 and 28 are formed in the bottom surface or base 19 of the first cover 12 to receive fibers 14, 16, 18 and 20. The fibers are installed in the V-grooves before the cover is positioned on layer 32.

Referring to FIG. 2a, optical fiber 14 represents a first optical signal source driven via optical signals from an external optical signal source received at pigtail 21 of fiber 14. Fiber 14 outputs the output signals via a collimating lens 25. The first optical signal passes across a small gap 27 to a second collimating lens 29 located on the left end of fiber 16. Optical fiber 16 represents an optical signal port and outputs the first optical signals out of pigtail end 30. Optical fibers 18 and 20 and their operation are similar in arrangement and function to fibers 14 and 16.

The use of a collimating lens on the end of a single mode fiber is discussed in U.S. patent application Ser. No. 09/628,015 filed Jul. 28, 2000, for a Fiber Lens Assembly For Single Mode Optical Switches by Norris Lewis and having a common Assignee the contents of which are incorporated herein by reference in their entirety.

The fiber to be used will include but not be limited to single mode fiber. Before installing the fibers in the first cover, the fiber's jacket is removed exposing the fiber's cladding, which has a diameter of approximately 125 um. The core (not shown) of single mode fiber has a diameter in the range of 7 to 9 micrometers. A graded index lens is shown on the end of each fiber at the center of the X pattern. The graded index lenses are approximately 300 um in length and provide the function of a collimating lens. The diameter of the beam formed by the lenses in an optical switch arrangement will determine if multi-mode fiber is practical. The core of Multi-mode fiber is much larger in diameter than single mode fiber so the resulting beam diameter is larger. A larger beam diameter implies that a larger actuation deflection is required which implies that the size of the entire expandable structure would have to be larger.

The layers of the first wafer, wafer A, are shown in FIG. 2a. The first wafer has a handle layer 32 with a thickness of approximately 325 um, an oxide layer 34 with a thickness of approximately 0.5 um, and a device layer 36 with a thickness of approximately 16 um. A first pattern of electrical contacts and traces 38 of gold are deposited on the base of device layer 36.

The layers of the second wafer, wafer B, are shown in FIG. 3. The second wafer has a handle layer 40 at the bottom of the stack with a thickness of approximately 325 um, an oxide layer 42 with a thickness of approximately 0.5 um, and a device layer 44 with a thickness of approximately 16 um. A second pattern of electrical contacts and traces 46 of gold is deposited on the top of device layer 44. The first and second patterns 38, 46 are formed to be congruent and are fused together using a thermal compression bond by application of heat and pressure as the first wafer registered above the second wafer and bonded to the second wafer. A second or bottom cover 50 is attached to the bottom of the handle layer 40.

FIGS. 4a–4c show the pattern on each of the first wafer, wafer A, layers as they would be viewed while penetrating the layers from the top of the first wafer stack at handle layer 32 to the bottom of the stack at device layer 36 containing the flexible transfer member.

Figure 5A:
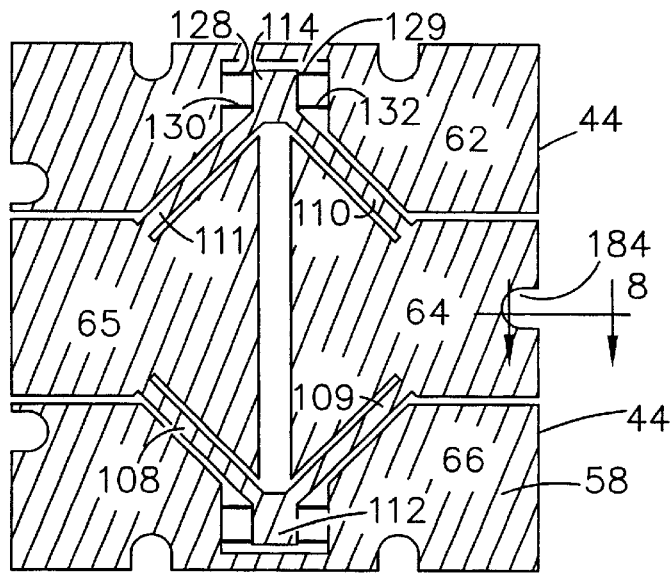
FIGS. 5*a*, 5*b* and 5*c* are plan views of the layers of wafer "B"
Figure 5B:
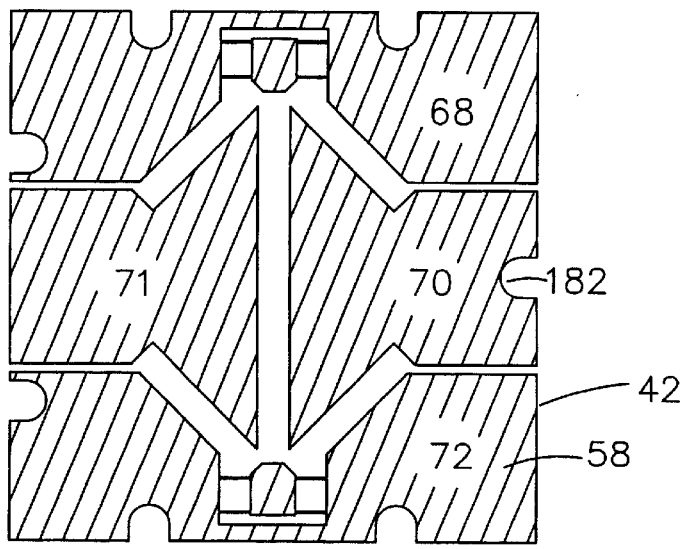
Figure 5C:
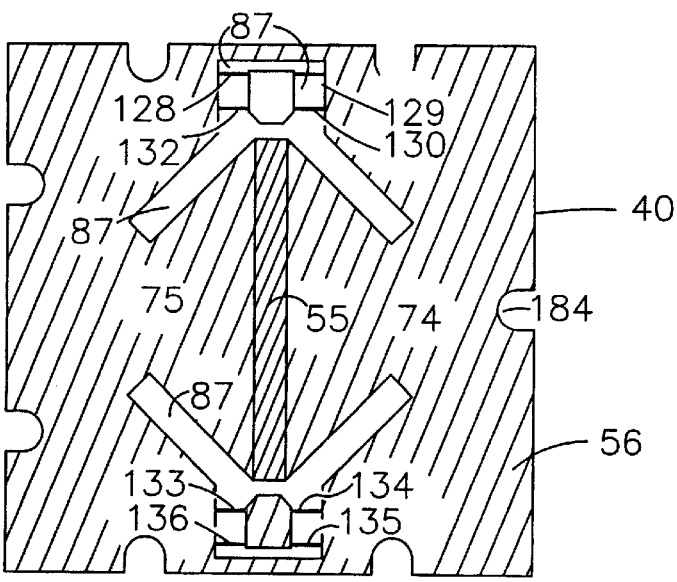

FIGS. 5a–5c show the pattern on each of the first wafer, wafer B, layers as they would be viewed while continuing to penetrate the layers of FIGS. 1–3 from the top of the second wafer at device layer 44 to the bottom of the stack at handle layer 40.

Operation of the Invention Bi-Stable Micro-Actuator

After the first and second wafers are processed using MEMS technology, and bonded with heat and pressure at the congruent electrical contact layers 38 and 46, a mechanical link is established between wafer "A" and wafer "B". The exploded views of FIGS. 1a, 1b, 2a, and 3 are for the purpose of illustrating positional relationships only since the layers of the respective wafers are not separated in practice. Referring to FIG. 4a–4c, the first wafer regions 56 on the mirror handle layer 32, region 58 on the oxide layer 34 and region 60 on the flexible transfer member device layer 36 are integrally fused by virtue of the wafer's construction. Device layer 36 of the first wafer or wafer "A" is joined to the device layer 44 of the second wafer or wafer "B" by operation of the thermal compression bond of layers 38 and 46 establishing a mechanical link. An oxide layer insulation (not shown) is deposited as required, masked and etched to facilitate the electrical contacts required from the first and second wafers for heating and state monitoring sensors. Referring to FIG. 5a–5c, Regions 62, 64, 65, 66 of the device layer 44, regions 68, 70, 71, 72 of the oxide layer 42 are integrally fused to regions 74 of the expandable structure handle layer 40, thereby forming a frame, to which the expandable structure is linked.

Referring again to FIGS. 1 and 2, the handle layer 32 is etched to form a first V-groove 76 followed by V-groove 78, 86 and 88 that are positioned to be complementary to V-grooves 22, 24, 26 and 28 formed in the inner surface of the first cover 12 after the first cover 12 is on the top of the stack. The four optical fibers, 14, 16, 18 and 20 initially installed in V-grooves formed in the base 19 of the first cover 12 register the first cover on handle layer 32 as the optical fibers seat in V-grooves 76, 78, 86 and 88.

Referring to FIG. 2, the first V-groove 76 has an axis that defines an optical signal path. Optical fiber 14 therefore represents a first optical signal source driven by optical signals from an external optical signal source (not shown) received at pigtail 21. Fiber 14 outputs the output signals via a collimating lens 24. The first optical signal passes across a small gap 26 to a second collimating lens 28 located on the left end of fiber 16. Optical fiber 16 therefore represent a first optical signal port positioned in a second portion of the V-groove 78 that is co-axially aligned with the collimated signal source to receive the optical signal, and outputs the first optical signals out of its rightmost pigtail end 30. Optical fibers 18 and 20 and their operation are similar in arrangement and function to fiber.

Figure 6A:
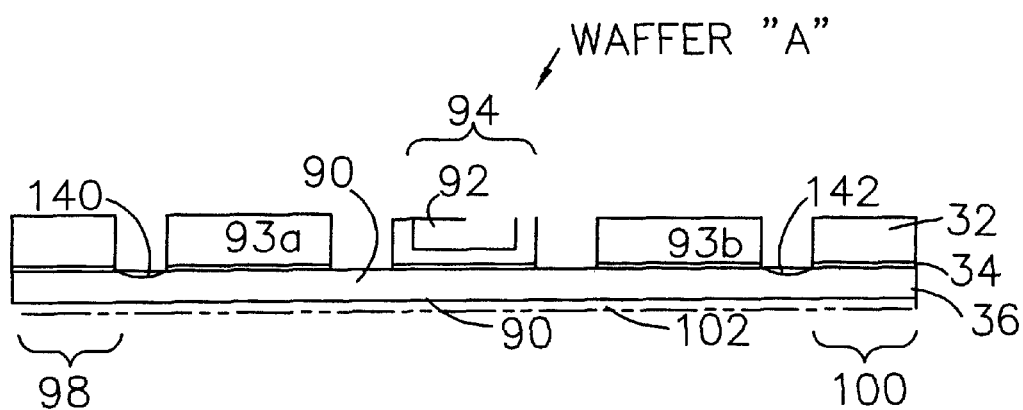
FIGS. 6*a*, 6*b* and 6*c* are schematic sectional views of the bi-stable micro-actuator showing the flexible transfer member in a relaxed state, a first and a second state.
Figure 6B:
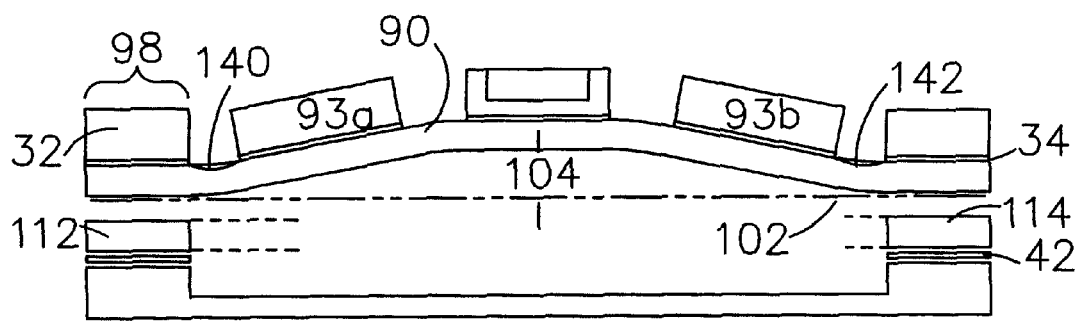
Figure 6C:
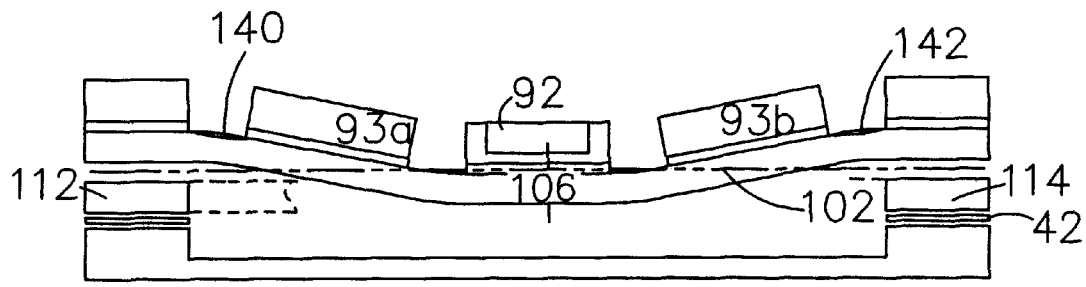

FIG. 2a, FIG. 4c and the sectional drawings of FIG. 6a–6c schematically show the flexible transfer member 90 formed in the device layer 36 of wafer A. Mirror surface 92 is shown formed from a central portion 94 of the handle layer 32 of wafer A on the central portion 94 of the flexible transfer member 90. The flexible transfer member is shown the location of a first point of support identified by brackets 98, and the location of a second point of support identified by bracket 100 at a first end and a second end of a compressive axis 102. In FIG. 6b, the flexible transfer member central portion 94 is shown displaced from the compressive axis 102 through an exaggerated distance 104 to be in a first state. The vertical location of the mirror surface 92 is raised in this first state. A single micro-actuator has a mechanical gain of about 100. A one micron movement of the support posts formed above and below support pads 98 and 100 along the compressive axis 102 produces approximately 100 micro inches of vertical movement of the central region 104 or 106.

Stiffiners 93a and 93b are shown formed from handle layer 32 on the left and right sides of the mirror 92. The stiffeners add mass to the flexible transfer member 90 and assist in completing its toggle motion from one state to the next when commanded by the control signal. Bowing of the flexible transfer member along its length is restricted along those regions occupied by stiffeners 93a and 93b thereby transferring the required flexure to the remaining regions along its length.

The Bosh Process which comprises inductively coupled plasma ion etching, sometimes called deep ion etching or RIE. Equipment makers such as Surface Technology Systems of Redwood City, Calif. is one such company. A plasma is used in connection with reactive gases in a sequence of successive etching and passivation steps through a photomasks to create a wall surface that it has a slightly scalloped surface. The Bosh company is believed to licenses the process. The etch rate is controlled by the flow rates and pressures. The process is know in the art. The Bosh Process etches independent of the crystallographic planes of the wafer.

The method used in making the present invention mirror is anisotropic etching process. Anisotropic etching is a wet chemical etching process typically using KOH or potassium hydroxide, as one of several etching materials or etchants. The etch rate is a function of the crystallographic plane so it is anisotropic in a sense in that it etches at different rates in different directions. That is used to form the V grooves, and the mirror structure. It is a standard process and it can be contracted out to companies such as IC Sensors, at Milpitas, Calif., U.S.A. Nova Sensors in Freemont, Calif. is also believed to be a source for this service. The general field is micro-machining which is referred to as MEMS (Micro Electro-Mechanical Systems) in the United States.

The use of the anisotropic etching process makes it possible to fabricate the mirror surface 92 out of the handle layer of the flexible transfer member. The process provides for automatic 45 degree alignment of the surfaces of the mirror with the V-grooves that align the optical source and ports. The process allows the mirror to be made sufficiently thin to accommodate the tolerance build associated with single mode light and the simultaneous reflection of two beams as the mirror is interposed in the path of crossed beams.

Each of the wafers "A" and "B" are identical. Vendors that supply SOI (silicon-on-insulator) wafers start out with two 4 inch or two six inch wafers of raw material. The handle is typically 325 microns thick. The silicon dioxide layer is approximately one half a micron thick. The device layers are approximately 16 microns thick.

FIG. 6c shows the flexible transfer member central portion 94 displaced from the compressive axis 102 through an exaggerated distance 106 to be in a second state. A portion of substrate "B" is shown and as the flexible transfer member center portion 94 transfers to a lower position into a recess formed through device layer 44, through oxide layer 42 and partially through handle layer 40. The recess is large enough to permit the flexible transfer member to transfer to the first state free of interference and also to provide thermal isolation between the flexible transfer member and the walls of the wafer "B".

The flexible transfer member 90 is stable and resides in a bowed first state or a bowed second state while subjected to a compressive force applied along its compressive axis 102 by elements of the expandable structure such as thermally expandable arms 108 and 110 shown in FIG. 3 and 5a via a bonded coupling at the expandable structures first and second point of support at posts 112 and 114 respectively.

The transfer member mirror surface 92 resides at a position free of the optical signal path with the flexible transfer member in a bowed first state.

FIG. 3 shows that the expandable structure formed in the device layer 44 of the second silicon dioxide layer is coupled to the frame via expandable arms 108 and 110 which are shown attached to regions 64 and 65 respectively of device layer 44. Regions 64 and 65 are bonded to the oxide layer 42 at region 70 and 71 respectively. Region 70 is then shown bonded to the handle layer region 74 while region 71 is shown bonded to region 75. Region 64 can also be seen to be bonded via the electrical contact layer to region 60 of device layer 36 in wafer "A". Region 60 is bonded via oxide layer 58 to region 56 of the handle of wafer "A".

As shown in FIG. 3, the expandable arms 108, 109, 110, 111 of the expandable structure have first and seconds end that terminate at the expandable structure's first and second end pads 112 and 114 respectively on the device layer 44. The first and second end pads 112, 114 of layer 44 are shown integrally fused or bonded via the oxide layer 42 pads 118, 120 to handle layer 40 pads 122, 124. These pad regions are integrally fused by the SOI structure to form an expandable structure first and second post 113, 115 respectively.

Referring to FIG. 2a, the expandable structure's first and second posts are coupled via the first and second end pads 112, 114 via metal in the electrical contact layers to the flexible transfer member's first and second point of support at pads 98, 100 on the flexible transfer member's device layer 36. Pads 98, 100 are fused by the nature of the SOI wafer via congruent pads of the oxide layer 34 to a congruent pad on handle layer 32 forming first and second flexible transfer member posts, the first and second flexible member posts being integral with the first and second posts of the expandable structure. Referring to FIGS. 3 and FIGS. 5a–5c, eight transverse beams or webs 128, 129, 130, 132, 133, 134, 135 and 136 are formed in wafer "B" by the MEMS technology processes to link the expandable structure's first and second posts to handle layer 40. Referring to FIG. 2a and FIGS. 4a–4c eight transverse beams or webs 140, 141, 142, 143, 144, 145, 146, and 147 are formed in wafer "A" by the MEMS technology processes to link the first and second flexible transfer member posts 99, 101 respectively at the first and second points of support pads 98 and 100 to handle layer 32. After the wafers "A" and "B" are bonded together by the electrical contact layers formed on the external surfaces of their individual device layer, the posts of the expandable structure and the posts of the flexible transfer member are integrally linked to form two separate posts at each end of the flexible transfer member with four web or transverse support elements extending from the posts to the frames.

During assembly, tooling is used to pre-deflect the expandable structure before bonding the wafer "A" to wafer "B" thereby allowing the expandable structure to apply a compressive force between the first and second point of support along the compressive axis 102 to hold the flexible transfer member 90 in compression in a bowed first state or a bowed second state.

Referring to FIG. 3, in operation in a first embodiment, a control signal, such as a buffered 5V logic signal, i.e., a 0–5V logic signal from a driver having a sufficient power handling capability, drives the heater comprising expandable structure elements such as 108 in series with 109 and 110 in series with 111 to expand the expandable structure. In an alternative embodiment, the same logic signal is applied to regions 64 and 65 at the same time. Posts 112 and 114 are grounded in this arrangement.

In the first embodiment, the logic signal has a first state such as a low or zero volts and second state or a high such as 5V, is applied to region 64 or 65, the alternate region 65 or 64 respectively being grounded. The logic signal drives current through the expandable arms 108, 109 and 110, 111 of the expandable structure to heat the arms causing them to expand and elongate thereby reducing or eliminating the compressive force applied to the flexible transfer members first and second points of support at pads 98, 100.

The expansion of the expandable structure and the concurrent reduction in the compressive force applied to the flexible transfer member in response to the control signal assuming a second state, allows the central portion of the flexible transfer member to move from a bowed first state past the compressive axis into a bowed second state or from a bowed second state past the compressive axis into a bowed first state with a subsequent restoration of the compressive force by the expandable structure.

In a first embodiment, movement of the transfer members central region 94 transfers the mirror surface 92 to a position between the collimated optical signal source or pigtail 21, 14, 26 and the optical port 28, 16, 30 to totally block, or in the case where a mirror is interposed, to totally reflect the optical signal path at gap 26 with the flexible transfer member in compression in a bowed second state; whereby, the bi-stable micro-actuator functions to provide an optical switch function by interrupting or reflecting the flow of the optical signal across gap 26.

In operation, the rising edge of the control signal is sharp and the corresponding heating of the expandable arms of the expandable structure takes place in a very short time interval causing a sharp momentary reduction of the compressive force applied to the flexible transfer member. The heating rate of the control signal is adjusted by adjusting the slope of the leading edge and the amplitude of the control signal so as to be sufficiently abrupt to cause the central portion of the flexible transfer member to accelerate toward the compressive axis in response to the reduction in the state of compression. The acceleration and mass of the central portion of the flexible transfer member are sufficient to move the central portion of the flexible transfer member past the compressive axis into an alternate or toggled or first or second bowed state, depending on the prior state, concurrent with restoration of the compressive force in response to removal of the control signal from the expandable structure.

In the embodiment of FIG. 3 and FIGS. 5a–5c, four expandable structural heating elements are formed as elements 108 109, 110 and 111 by adjusting the resistivity of the semiconductor material in the elements to provide the heating required when subjected to the control signal second state. It should be apparent that alternative patterns might be contrived to meet specific design goals including heating elements having arced or elliptical segments.

FIGS. 6a–6c show two indiffused regions 140 and 142 doped into the wafer "A" device layer 36 that represent a means for providing a first electrical signal characterized to indicate when the flexible transfer member is in a bowed first state and a second electrical signal characterized to indicate when the flexible transfer member is in a bowed second state. In a first alternative embodiment, the two regions comprise indiffused piezo resistive sites on the flexible transfer member device layer 36. The two regions are electrically coupled to the electrical contact layer to permit their use with signal definition circuitry to determine which direction the flexible transfer member is bowed. When biased, the indiffused regions provide a first output signal indicating that the flexible transfer member is in a bowed first state, i.e. a state in which the first optical signal passes across the small gap 27 to a second collimating lens 29 located on the left end of fiber 16 free of interference. A second electrical signal is provided to indicate when the flexible transfer member is in a bowed second state.

Figure 7:
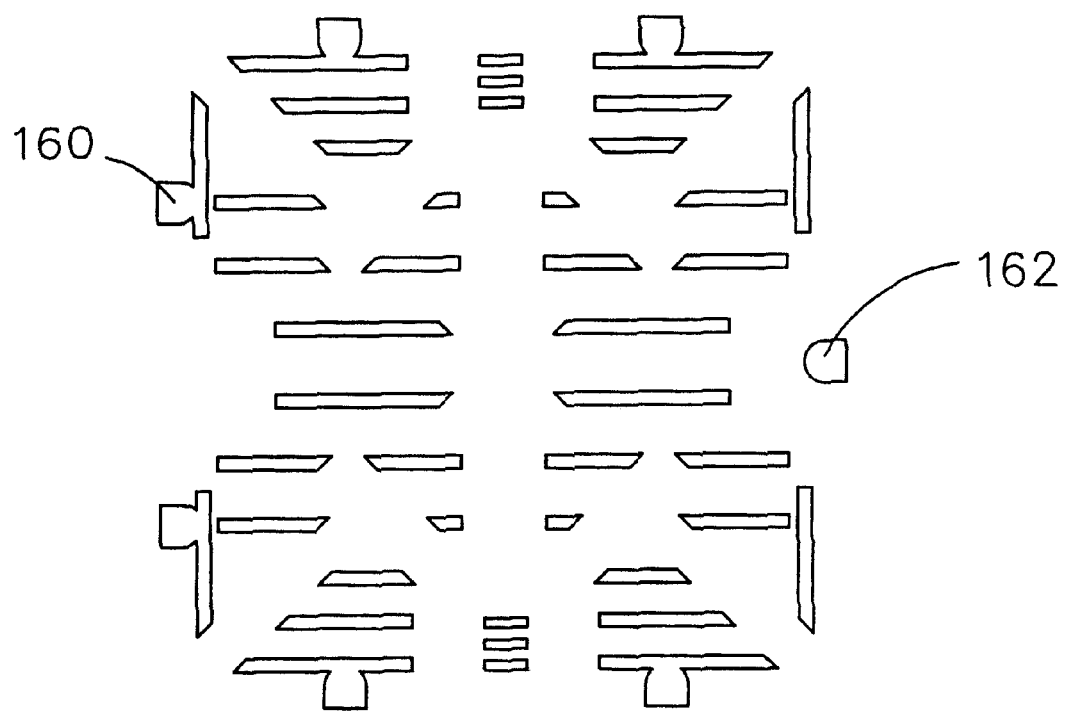
FIG. 7 is a plan view of the electrical contact layers formed on the bottom of the device layer of wafer "A" and formed on the top of the device layer of wafer "B"

FIGS. 6a–6c are schematics of sectional drawing of FIG. 2a taken through the longitudinal axis of the flexible transfer member 90. Corresponding layers from FIG. 3 are also shown. It may be possible in alternative embodiments, to position piezo resistive sensors on or into the flexible transfer member as at other locations than those shown. The indiffused regions 140, 142 of FIGS. 6b and 6c show that each piezo resistive element alternatively experience a tensile force in the first state of FIG. 6c in which the mirror 92 is below the path of the optical beam, followed by a compressive force as the flexible transfer member is transferred from the first stable state of FIG. 6c into a second stable state of 6b. The resistance of the piezo resistive devices will change as a function of the state of the flexible transfer member. Electrical connections to the ends of the piezo resistive devices would be made by bringing signal lines out along the transverse beams 140–143 and 144–147 of FIG. 4a to semicircular edge connection pads (not shown) on FIG. 5. Referring again to FIG. 2, even though the piezo resistive devices appear in wafer A, the contact would be connected via gold pads such as pads 160, 162 in layer 4 shown in FIG. 7 to the semi-cylindrical edge connections in wafer "B". The respective signal lines would then be connected to apertures in the edge of the package and then to a card or protective package pin via a flying lead. As stated above, the metalized regions depicted on FIG. 7 are for illustration purposes only. The patterns actually required will be the result of design choices made for the purpose of making the required electrical connections from the heater elements to edge connections on the package and from piezo-resistive diffusions implanted for the purpose of identifying the state in which the flexible transfer element resides, i.e., in its first state in which the light beam passes without restriction to a port in its path or its second state in which the light beam is blocked or is reflected to an alternate port.

Figure 8:
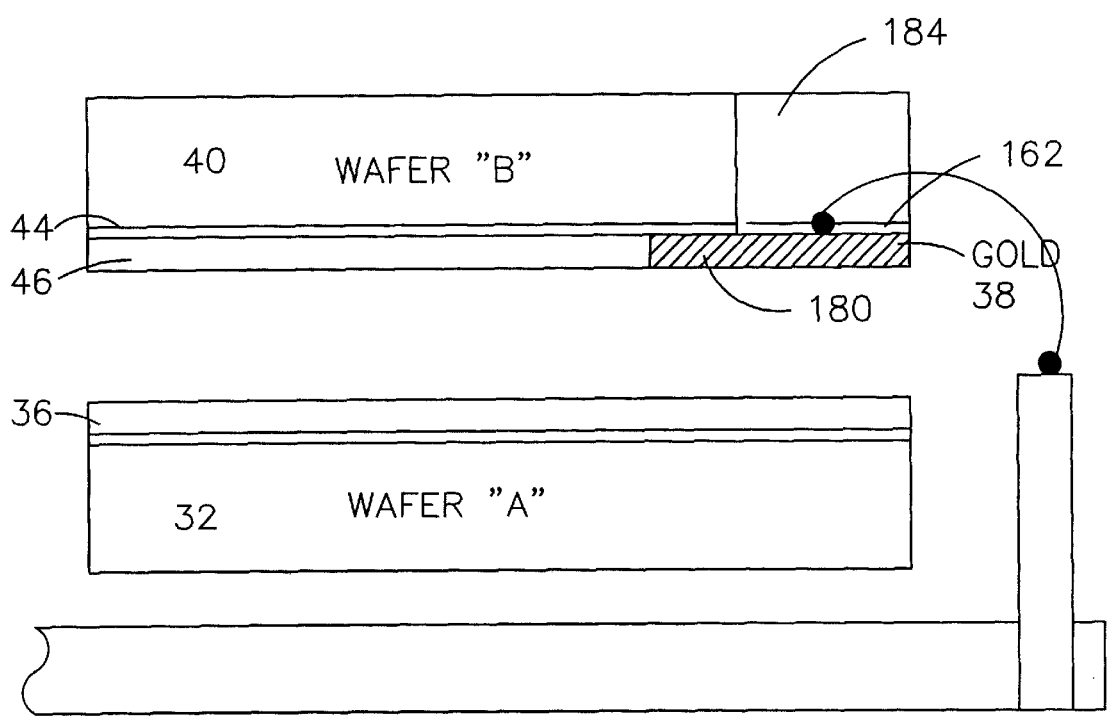
FIG. 8 shows a schematic sectional depiction of wafer "B" along section line 8—8 taken on the exploded view of FIG. 3 and FIG. 5*a*.

FIG. 8 shows a schematic sectional depiction of wafer "B" along section line 8—8 taken on the exploded view of FIG. 3 and FIG. 5a showing semicircular edge connection pads 180–186 from the handle to the metal electrical contact layer. FIG. 8 shows how an electrical contact is established from the electrical contact layer to a post in a protective package or card.

While the invention has been explained in connection with several embodiments, it is intended that the appended claims be used to limit the scope of this patent.

What is claimed is:

1. A micro-actuator responsive to a control signal having a first state and a second state, the micro-actuator comprising:

a flexible transfer member having a central portion and first and second ends located along a compressive axis; and an expandable structure coupled to the first and second ends of the flexible transfer member for applying a compressive force to the flexible transfer member, the expandable structure having at least a first resistivity element to provide sufficient heating in response to the control signal to heat the element to a temperature sufficient to momentarily relax the compressive force applied to the flexible transfer member, allowing the central portion of the flexible transfer member to accelerate toward the compressive axis, the acceleration and mass of the central portion of the flexible transfer member being sufficient to move the central portion past the compressive axis into a bowed second stable state with restoration of the compressive force by the expandable structure.

2. A micro-actuator responsive to a control signal comprising:

a flexible transfer member having a first and second point of support at a first and a second end of a compressive axis and a central portion displaced from the compressive axis; and an expandable structure coupled to a frame having a first and a second end coupled to drive the transfer member by applying a compressive force between the first and second point of support along the compressive axis to hold the flexible transfer member in compression in a bowed first state, the compressive force applied to the flexible transfer member being reduced in response to the control signal, causing the central portion of the flexible transfer member to accelerate toward the compressive axis in response to the reduction in compression, the acceleration and mass of the central portion of the flexible transfer member being sufficient to move the central portion of the flexible transfer member past the compressive axis into a second bowed state concurrent with restoration of the compressive force by the expandable structure.

3. The micro-actuator of claim 2 wherein:

the expandable structure further comprises heater means responsive to the control signal for momentarily heating the expandable structure to momentarily cause elongation thereby momentarily relaxing the compressive force applied to the flexible transfer member.

4. The micro-actuator of claim 2 wherein the expandable structure further comprises:

at least a first structural element coupled between the expandable structure's first or second point of support and the frame, the first structural element having an electrical heating element, the electrical heating element being responsive to the control signal to heat the first structural element to a temperature sufficient to momentarily relax the compressive force applied to the flexible transfer member causing a momentary elongation of the first structural element, momentarily relaxing the compressive force applied to the flexible transfer member.

5. The micro-actuator of claim 2 wherein the expandable structure further comprises:

at least a first structural element coupled between the expandable structure's first and second point of support; and an electrical heater means responsive to the control signal for heating the first structural element to a temperature sufficient to momentarily relax the compressive force applied to the flexible transfer member, causing a momentary elongation of the first structural element, momentarily relaxing the compressive force applied to the flexible transfer member.

6. A micro-actuator responsive to a control signal comprising:

a flexible transfer member having a first and second point of support at a first end and a second end of a compressive axis, and a central portion displaced from the compressive axis;

an expandable structure coupled to a frame having a first and second end coupled to drive the transfer member by applying a compressive force between the first and second point of support along the compressive axis to hold the flexible transfer member in compression in a bowed first state, at least a first element positioned between the first and second point of support of the flexible member pre-stressed to apply a compressive force between the first and second points of support in the absence of a control signal; and means for elongating the first element and reducing the compressive force in response to the control signal.

7. A micro-actuator responsive to a control signal comprising:

a flexible transfer member having a first and second point of support at a first and a second end of a compressive axis, and a central portion displaced from the compressive axis;

an expandable structure coupled to a frame having a first and second end coupled to drive the transfer member by applying a compressive force between the first and second point of support along the compressive axis to hold the flexible transfer member in compression in a bowed first state;

at least a first collimated optical signal source coupled to the frame and providing an optical signal via an optical signal path;

at least a first optical port coupled to the frame and co-axially aligned with the collimated signal source to receive the optical signal; and a transfer member surface positioned on the central portion of the flexible transfer member, the transfer member surface residing at a position free of the optical signal path with the flexible transfer member in compression in a bowed first state, the transfer member surface residing at a position to totally block or reflect the optical signal path with the flexible member in compression in a bowed second state;

whereby the micro-actuator functions to provide an optical switch function.

8. A micro-actuator responsive to a control signal comprising:

a flexible transfer member having a first and second point of support at a first and a second end of a compressive axis, and a central portion displaced from the compressive axis;

an expandable structure coupled to a frame having a first and second end coupled to drive the transfer member by applying a compressive force between the first and second point of support along the compressive axis to hold the flexible transfer member in compression in a bowed first state;

at least a first collimated optical signal source coupled to the frame and providing an optical signal via an optical signal path;

at least a first optical port and a second optical port, the first and second optical ports being coupled to the frame, the first optical port being co-axially aligned with the first collimated signal source; and a transfer member mirror surface positioned on the central portion of the flexible transfer member, the transfer member mirror surface residing at a position free of the optical signal path with the flexible transfer member in compression in a bowed first state while the first optical signal port receives the optical signal from the first collimated signal source, the transfer member surface moving to a second position to reflect the optical signal to a path co-axial with the axis of the second optical port with the flexible transfer member in compression in a bowed second state;

whereby the micro-actuator functions to provide an optical switch function.

9. A micro-actuator responsive to a control signal comprising:

a flexible transfer member having a first and second point of support at a first and a second end of a compressive axis, and a central portion displaced from the compressive axis;

an expandable structure coupled to a frame having a first and second end coupled to drive the transfer member by applying a compressive force between the first and second point of support along the compressive axis to hold the flexible transfer member in compression in a bowed first state;

at least a first and a second collimated optical signal source coupled to the frame and respectively providing a first optical signal a second optical signal via respective first and a second optical signal paths;

at least a first optical port and a second optical port, the first and second optical ports being coupled to the frame, the first optical port being co-axially aligned with the first collimated signal source, the second optical port being co-axially aligned with the second collimated signal source;

a thin transfer member plate having parallel planar surfaces positioned substantially on the central portion of the flexible transfer member, the parallel planar surfaces being first and second mirror surfaces on opposite surfaces of the transfer member, the transfer member mirror surfaces residing at a position free of the first and second optical signal paths with the flexible transfer member in compression in a bowed first state while the first optical signal port receives the first collimated optical signal from the first optical signal source, and the second optical signal port receives the second collimated optical signal from the second optical signal source, and with the flexible transfer member in compression in a bowed second state, the transfer member first and second mirror surfaces moving to a second position to reflect the first collimated optical signal to a path co-axial with the axis of the second optical port and the second collimated optical signal to a path co-axial with the axis of the first optical signal port, the second optical port receiving the first collimated optical signal from the first optical signal source, and the first optical signal port receiving the second collimated optical signal from the second optical signal source;

whereby the micro-actuator functions to provide an optical switch function.

10. A micro-actuator comprising:

a frame formed by the handle layers of a first and a second silicon-on-insulator wafer, each silicon-on-insulator wafer having a handle layer, an oxide layer and a device layer; the device layer of the first and second silicon on insulator wafers being joined by an electrical contact layer, a first cover having an outer and inner surface, the inner surface having at least a first V-groove, the first V-groove having an axis defining an optical signal path, at least a first collimated optical signal source positioned in a first portion of the V-groove and providing an optical signal along the optical signal path, at least a first optical port positioned in a second portion of the V-groove and co-axially aligned with the collimated signal source to receive the optical signal, the first silicon-on-insulator wafer handle layer having a top and bottom surface, the top surface having a V-groove corresponding to the first cover inner surface V-groove, the top surface V-groove receiving and aligning the first collimated signal source and the first optical port as the cover inner surface is bonded to the first silicon-on-insulator wafer handle layer top surface, a flexible transfer member formed in the device layer of the first silicon-on-insulator wafer having a mirror surface formed from a portion of the handle layer of the first silicon on insulator wafer on a central portion of the flexible transfer member, the flexible transfer member having a first and second point of support at a first end and a second end of a compressive axis, the flexible transfer member central portion being displaced from the compressive axis, the flexible transfer member being in a bowed first state or a bowed second state while subjected to a compressive force, the transfer member mirror surface residing at a position free of the optical signal path with the flexible transfer member in a bowed first state, an expandable structure formed in the device layer of the second silicon on insulator wafer, the expandable structure being coupled to the frame and having a first and second end coupled to drive the flexible transfer member's first and second point of support, the expandable structure being characterized to apply a compressive force between the first and second point of support along the compressive axis to hold the flexible transfer member in compression in a bowed first state or a bowed second state, a control signal having a first state and second state, the expandable structure expanding to reduce the compressive force applied to the flexible transfer member in response to the control signal assuming a second state, the central portion of the flexible transfer member moving from a bowed first state past the compressive axis into a bowed second state or from a bowed second state past the compressive axis into a bowed first state with restoration of the compressive force by the expandable structure, the transfer member mirror surface moving to a position between the collimated optical signal source and the optical port to totally block or reflect the optical signal path with the flexible transfer member in compression in a bowed second state; whereby, the micro-actuator functions to provide an optical switch function.

11. The micro-actuator of claim 10 wherein the expandable structure further comprises:

at least a first structural element coupled between the expandable structure's first or second point of support and the frame, the first structural element having, an electrical heating element, the electrical heater being responsive to the control signal momentary second state to heat the first structural element to a temperature sufficient to momentarily relax the compressive force applied to the flexible transfer member causing a momentary elongation of the first structural element momentarily relaxing the compressive force applied to the flexible transfer member allowing the central portion of the flexible transfer member to accelerate toward the compressive axis, the acceleration and mass of the central portion of the flexible transfer member being sufficient to move the central portion past the compressive axis into a bowed second stable state with restoration of the compressive force by the expandable structure.

12. The micro-actuator of claim 10 wherein the expandable structure further comprises:

a first and second structural element coupled between the expandable structure's first point of support and the frame, and a third and fourth structural element coupled between the expandable structure's second point of support and the frame the first structural element having, an electrical heating element for each respective structural element, the electrical heaters being responsive to the control signal momentary second state to heat each respective structural element to a temperature sufficient to momentarily relax the compressive force applied to the flexible transfer member causing a momentary elongation of the first structural element momentarily relaxing the compressive force applied to the flexible transfer member allowing the central portion of the flexible transfer member to accelerate toward the compressive axis.

13. The micro-actuator of claim 10 wherein the expandable structure electrical heating elements for each respective structural element further comprises:

regions in the second silicon-on-insulator wafer device layer doped to have a resistance characterized to provide sufficient power dissipation when electrically driven by the control signal second state to momentarily relax the compressive force applied to the flexible transfer member allowing the central portion of the flexible transfer member to accelerate toward the compressive axis.

14. The micro-actuator of claim 10 wherein the second silicon-on-insulator wafer handle layer is etched to provide void space around a substantial portion of the expandable structure first structural element and its respective electrical heating element to provide thermal resistance between the electrical heating element and the flexible transfer member.

15. The micro-actuator of claim 10 wherein the flexible transfer member further comprises:

means for providing a first electrical signal characterized to indicate when the flexible transfer member is in a bowed first state and a second electrical signal characterized to indicate when the flexible transfer member is in a bowed second state.

16. The micro-actuator of claim 10 wherein the flexible transfer member further comprises:

indiffused piezo resistive sites on the flexible transfer member electrically coupled to the electrical contact layer and characterized to provide a first output signal characterizing when the flexible transfer member is in a bowed first state and a second electrical signal characterizing when the flexible transfer member is in a bowed second state.

17. A method for forming a micro-actuator comprising the steps of:

providing a first and second silicon-on-insulator wafer, each respective silicon-on-insulator wafer having a device layer, an oxide layer and a handle layer, using a plasma with reactive gases in a sequence of successive etching and passivation steps through a photomasks, create a flexible transfer member having a first and second point of support at a first end and a second end of a compressive axis, in the device layer of the first silicon-on-insulator wafer, using wet chemical anisotropic etching with potassium hydroxide, in which the etch rate is a function of the crystallographic plane form a mirror from the handle layer of the first silicon-on-insulator wafer, using a plasma with reactive gases in a sequence of successive etching and passivation steps through a photomasks on the second silicon oxide wafer, create an expandable structure coupled to a frame, the expandable structure having a first and second end coupled to drive the transfer member's first and second point of support, the expandable structure being characterized to apply a compressive force between the first and second point of support along the compressive axis to hold the flexible transfer member in compression in a bowed first or second state, using photomasks, form an electrical contact layer on the external surface of the first and second silicon-on-insulator wafers, the contact patterns being characterized to couple a control signal having a first state and second state from an external signal source to the expandable structure, thermal compression bonding the electrical contact layers on the first and second silicon-on-insulator wafers together with a gold layer using heat and pressure, the expandable structure being characterized to expand to reduce the compressive force applied to the flexible transfer member in response to the control signal assuming a second state, the central portion of the flexible transfer member moving past the compressive axis into a bowed second state with restoration of the compressive force by the expandable structure.

18. The method for forming a micro-actuator of claim 17 further comprising the steps of:

using a Bosh process in a sequence of successive etching and passivation steps through a photomasks, create a flexible transfer member having a first and second point of support at a first end and a second end of a compressive axis, in the device layer of the first silicon-on-insulator wafer, using wet chemical anisotropic etching with potassium hydroxide, in which the etch rate is a function of the crystallographic plane form a mirror from the handle layer of the first silicon-on-insulator wafer, using a Bosh process in a sequence of successive etching and passivation steps through a photomasks on the second silicon oxide wafer, create an expandable structure coupled to a frame, the expandable structure having a first and second end coupled to drive the transfer member's first and second point of support, the expandable structure being characterized to apply a compressive force between the first and second point of support along the compressive axis to hold the flexible transfer member in compression in a bowed first or second state, using photomasks, form an oxide layer and an electrical contact layer therethrough on the external surface of the first and second silicon-on-insulator wafers, the contact patterns being characterized to couple a control signal having a first state and second state from an external signal source to drive the heater on the expandable structure, thermal compression bonding the electrical contact layers on the first and second silicon-on-insulator wafers together using heat and pressure, the expandable structure being characterized to expand to reduce the compressive force applied to the flexible transfer member in response to the control signal assuming a second state, the central portion of the flexible transfer member moving past the compressive axis into a bowed second state with restoration of the compressive force by the expandable structure.

19. The method for forming the micro-actuator of claim 17 further comprising a preliminary step of doping the second silicon-on-insulator wafer before etching to obtain a heating element in the expandable structure having a resistivity characterized to provide sufficient heating to respond to the control signal momentary second state to heat the heating element to a temperature sufficient to momentarily relax the compressive force applied to the flexible transfer member causing a momentary elongation of the first structural element, momentarily relaxing the compressive force applied to the flexible transfer member allowing the central portion of the flexible transfer member to accelerate toward the compressive axis, the acceleration and mass of the central portion of the flexible transfer member being sufficient to move the central portion past the compressive axis into a bowed second stable state with restoration of the compressive force by the expandable structure.

* * * * *